(12) United States Patent
Zhou et al.

(10) Patent No.: US 12,073,967 B2
(45) Date of Patent: Aug. 27, 2024

(54) MICROCOIL ELEMENT, ARRAY-TYPE MICROCOIL ELEMENT AND DEVICE

(71) Applicants: SOUNDS GREAT CO., LTD., Taipei (TW); XIAMEN SOUNDS GREAT ELECTRONIC SCIENCE AND TECHNOLOGY CO., LTD., Xiamen (CN)

(72) Inventors: Hong-Da Zhou, Taipei (TW); Chin-Hung Luo, Taipei (TW); Jung-Wai Wu, Taipei (TW); Wen-Yao Chiang, Taipei (TW)

(73) Assignees: SOUNDS GREAT CO., LTD., Taipei (TW); XIAMEN SOUNDS GREAT ELECTRONIC SCIENCE AND TECHNOLOGY CO., LTD., Xiamen (CN)

( * ) Notice: Subject to any disclaimer, the term of this patent is extended or adjusted under 35 U.S.C. 154(b) by 837 days.

(21) Appl. No.: 17/163,656

(22) Filed: Feb. 1, 2021

(65) Prior Publication Data
US 2022/0189672 A1 Jun. 16, 2022

(30) Foreign Application Priority Data
Dec. 11, 2020 (TW) .................................. 109143748

(51) Int. Cl.
*H01F 17/00* (2006.01)
*H01F 27/28* (2006.01)
(Continued)

(52) U.S. Cl.
CPC ..... *H01F 17/0006* (2013.01); *H01F 27/2804* (2013.01); *H01L 23/5227* (2013.01); *H01F 2017/0073* (2013.01); *H01F 41/042* (2013.01)

(58) Field of Classification Search
CPC .... H01F 5/003; H01F 5/04; H01F 2017/0073; H01F 17/0006; H01F 27/28;
(Continued)

(56) References Cited

U.S. PATENT DOCUMENTS 5,583,474 A * 12/1996 Mizoguchi .......... H01F 17/0006
336/200
7,791,440 B2 * 9/2010 Ramadan .............. H01F 41/046
335/297
(Continued)

FOREIGN PATENT DOCUMENTS

CN 112489919 A 3/2021
CN 214226655 U 9/2021

*Primary Examiner* — Malcolm Barnes
(74) *Attorney, Agent, or Firm* — Li & Cai Intellectual Property (USA) Office

(57) ABSTRACT

A microcoil element, an array-type microcoil element and a device are provided. The microcoil element includes a wiring layer having continuous multiple metal line segments that form multiple loops around a starting point of the element. Every metal line segment includes a first electrode end and a second electrode end. The microcoil element includes an electrode layer having a first electrode zone and a second electrode zone that respectively collect the first electrode ends and the second electrode ends of the multiple metal line segments. When designing the microcoil element, parameters such as a total length of the multiple line segments, a line width, a line spacing of adjacent line segments, a length of each line segment, turns of the microcoil, and a loop distance according to impedance requirement. The single microcoil element or the array-type microcoil element can be used as a magnetic component of a device.

18 Claims, 9 Drawing Sheets

(51) Int. Cl.
  *H01F 41/04* (2006.01)
  *H01L 23/52* (2006.01)
  *H01L 23/522* (2006.01)
(58) Field of Classification Search
  CPC ......... H01F 27/2804; H01F 2027/2809; H01F 28/29; H01F 41/042; H01F 7/064; H01F 2007/068; H01F 7/06; H01L 23/5227
  See application file for complete search history.

(56) References Cited

U.S. PATENT DOCUMENTS

| | | | |
|---|---|---|---|
| 2005/0275497 A1* | 12/2005 | Ramadan | H01L 23/5227 336/200 |
| 2013/0293025 A1* | 11/2013 | Xu | H02J 50/402 307/104 |
| 2016/0172104 A1* | 6/2016 | Mirbozorgi | H02J 50/12 320/108 |
| 2017/0352458 A1* | 12/2017 | Lerner | H01F 27/28 |
| 2020/0066438 A1* | 2/2020 | Lee | H01L 28/10 |

* cited by examiner

MICROCOIL ELEMENT, ARRAY-TYPE MICROCOIL ELEMENT AND DEVICE

FIELD OF THE DISCLOSURE

The disclosure is related to a microcoil element, and more particularly to microcoil element that is made of multiple loops of metal lines for generating a magnetic field and a device using the same.

BACKGROUND OF THE DISCLOSURE

It is commonly that a magnetic component such as a magnet or a coil made of metal windings for generating a magnetic field has a certain volume and weight. If the conventional magnetic component is used in an electronic device, the electronic device will become heavier or need to prepare a certain amount of space for disposing these magnetic components.

If the conventional magnetic component is applied to a miniaturized electronic device, e.g., an earphone, a hearing aid or a small speaker, the magnetic component requires special materials or design for the purpose to be disposed in the device. Nevertheless, the effect of miniaturization of the electronic device may be restricted due to the physical limitation made by the requirement of strength of magnetic field. In other words, the miniaturization of the device may require reducing the volume and weight of the magnetic component and accordingly diminish the effect of magnetic components.

Although there is technology got significant progress in materials of the magnetic components that are configured to generate a magnetic field, the conventional technology still suffers physical limitations and needs to overcome high cost issues.

SUMMARY OF THE DISCLOSURE

The present disclosure is related to a microcoil element that includes a wiring layer and an electrode layer. The wiring layer is formed of multiple loops of continuous multiple metal line segments having a starting point and around the starting point. Two ends of each of the metal line segments are configured to be a first electrode end and a second electrode end respectively. The starting point is a first electrode of the microcoil element. The end point of the continuous multiple metal line segments is a second electrode of the microcoil element. The microcoil element includes an electrode layer that includes at least one first electrode zone and at least one second electrode zone. The first electrode zone is used to converge multiple first electrode ends of the metal line segments. The second electrode zone is used to converge multiple second electrode ends of the metal line segments.

Further, in an electrode layer, the first electrode end of every metal line segment on the wiring layer is leaded to the at least one first electrode zone via multiple metal lines, and the second electrode end of every metal line segment is leaded to the at least one second electrode zone via multiple metal lines.

Alternatively, the microcoil element includes an electrical connection layer, on the electrical connection layer, multiple metal lines lead the first electrode ends of multiple metal line segments on the wiring layer to the at least one first electrode zone of the electrode layer, and also lead the second electrode ends of the multiple metal line segments to the at least one second electrode zone of the electrode layers.

Thus, in one embodiment of the disclosure, the first electrode end of every metal line segment on the wiring layer is a negative electrode, and the second electrode end is a positive electrode. The positive electrodes of the multiple metal line segments are connected in parallel through vias, and the negative electrodes are also connected in parallel through other vias.

In an aspect, a starting point of the microcoil element is disposed a position near a central point of the element. The starting point forms a first electrode of the microcoil element. The multiple continuous multiple metal line segments form a concentric circle layout or a concentric polygon layout around the starting point.

When designing the microcoil element, a total length, a line width, a line spacing between adjacent metal line segments, a length of each line segment, turns of microcoil, a loop distance and/or material of the metal line segments are determined according to a requirement of an impedance value, a magnetic field or size of the microcoil element.

In one embodiment of the disclosure, the multiple microcoil elements constitute an array-type microcoil element. Each of the microcoils of the microcoil elements is energized to form a magnetic field equivalent to a multiturn coil. The array-type microcoil element is used to generate an equivalent magnetic field through the energized multiple microcoil elements.

In one further aspect of the disclosure, a microcoil device includes a shell, at least one magnetic component that is consisted of one or more microcoil elements, and a circuit board that connects to a power supply for supplying power to the at least one magnetic component.

The magnetic component can be a single one microcoil element or an array-type microcoil element.

Further, in accordance with a requirement of the impedance value, the magnetic field or size, the magnetic component is configured to dispose multiple microcoil elements or multiple layers of the array-type microcoil elements.

Still further, in accordance with a requirement of the equivalent magnetic field, the array-type microcoil element is configured to dispose multiple different shapes or sizes of microcoil elements; or alternatively, the array-type microcoil element is configured to dispose an outer coil unit around one or more microcoil elements.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
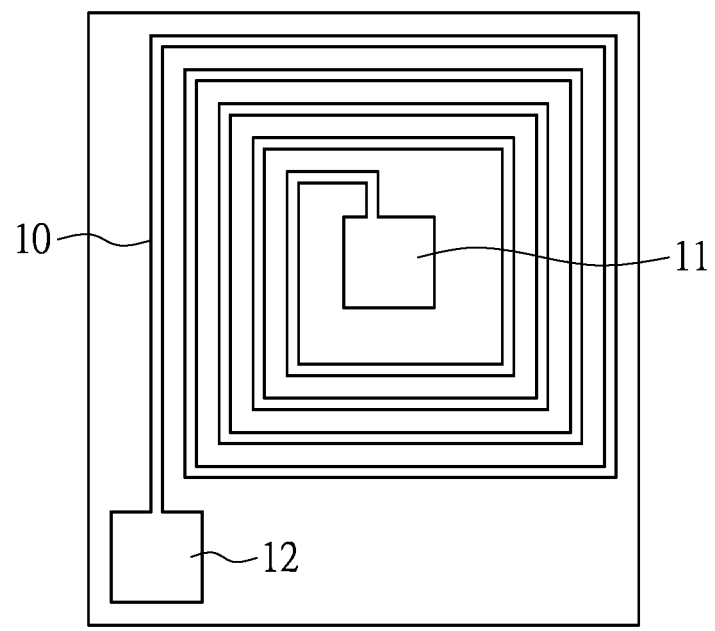
FIG. 1 is a schematic diagram depicting a microcoil element according to one embodiment of the disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

According to one of the embodiments of the disclosure, a microcoil element, an array-type microcoil element formed of multiple microcoil elements and a device having a magnetic component implemented by single one microcoil element or the array-type microcoil element.

The structure of the microcoil element is shown in FIG. 1 according to one embodiment of the disclosure. The microcoil element can be formed upon a substrate that is an insulator through a coating process, a metallization process or an etching process using a mask. The microcoil element forms as a continuous metal line 10 upon the substrate and two ends of the metal line 10 act as contacts, in which a first electrode 11 can be a negative electrode of the microcoil element and a second electrode 12 can be a positive electrode of the microcoil element.

When the microcoil element is energized by the power supply, a stable current flows the microcoil element so as to generate a uniform magnetic field. The parameters such as materials of the metal line 10, a line width, a length of each line segment, and turns of the microcoil are referred to so as to determine an impedance value of the microcoil element. Accordingly, the impedance value and the magnetic field form the conditions for designing the microcoil element.

Figure 2:
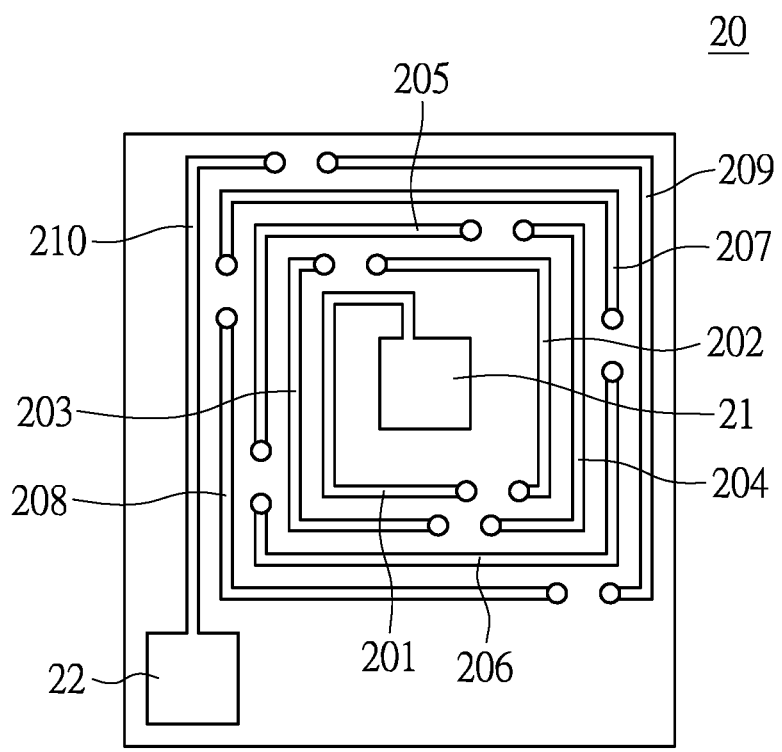
FIG. 2 is a schematic diagram depicting wirings upon the microcoil element according to one embodiment of the disclosure.

According to the embodiment of the disclosure, the metal line of the microcoil element is segmented into multiple break points based on a demand. Reference is made to FIG. 2, which is a schematic diagram depicting a layout of the microcoil element in one embodiment of the disclosure.

A microcoil unit 20 is schematically shown in FIG. 2. Main components of the microcoil unit 20 include a wiring layer and an electrode layer. The wiring layer includes multiple loops of continuous multiple metal line segments (201, 202, . . . , 210) that are formed from a starting point and around the starting point. The starting point can be disposed at any position of the microcoil element based on a practical demand; for example, but not limited to, the starting point can be at the position near a central portion of the microcoil element. The starting point acts as a first electrode 21 that can be a negative electrode of the microcoil element, and the other end of the continuous multiple metal line segments (201, 202, . . . , 210) acts as a second electrode 22 that can be a positive electrode of the microcoil element.

Furthermore, each segment of the multiple metal line segments (201, 202, . . . , 210) includes two ends, in which a first electrode end can be the end closer the starting point forms one end of the first electrode 21, and a second electrode end can be the other end closer the end of the metal line segment and forms the second electrode 22.

Figure 3:
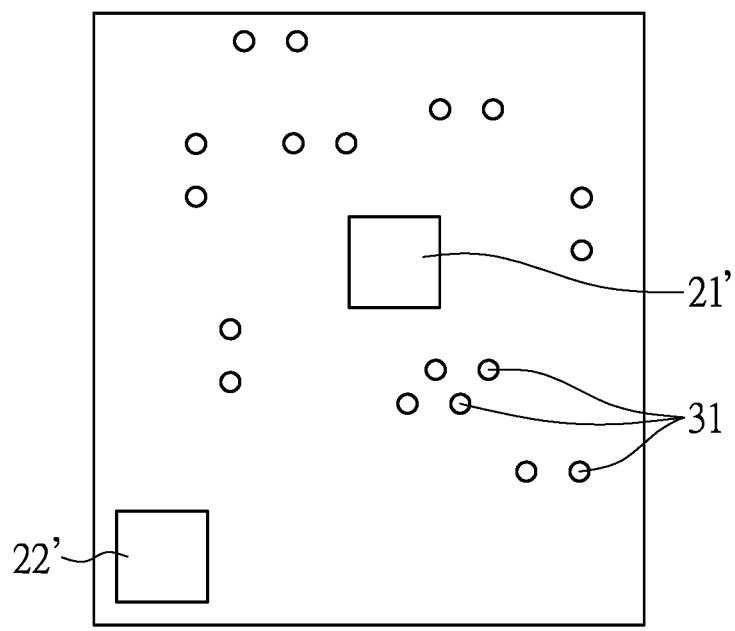
FIG. 3 is a schematic diagram depicting a contact layer of the microcoil element in one embodiment of the disclosure.

Next, reference is made to FIG. 3, which is schematic diagram depicting a contact layer of the microcoil element being shown in FIG. 2. The contact layer includes multiple contacts 31 that correspond to the ends of the multiple metal line segments over the wiring layer and multiple ends that correspond to the first electrode 21 and the second electrode 22 of the microcoil element. For example, the first electrode 21 and the second electrode 22 correspond to a first electrode contact 21' and a second electrode contact 22'.

According to structural features of the wiring layer of the microcoil element shown in FIG. 2 and FIG. 3, the microcoil element is designed according to practical demand such as an impedance value, a magnetic field or size of the microcoil element. The parameters affecting the impedance value, the magnetic field or the size are such as a total length, a line width, a line spacing between adjacent metal line segments, a length of each line segment, turns of microcoil, a loop distance and/or material of the metal line segments. The mentioned practical demand means a requirement of a microcoil device according to one of the applications of the microcoil element. For example, a single microcoil element can be applied to the microcoil device or alternatively an array-type microcoil element having multiple microcoil elements schematically shown in FIGS. 4A through 4D can also be applied to the microcoil device.

Figure 4A:
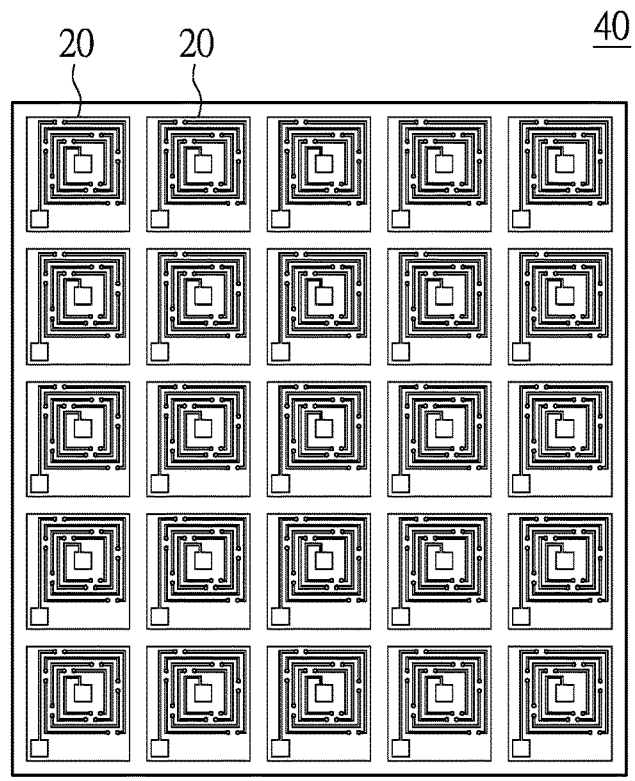
FIG. 4A through FIG. 4D show schematic diagrams depicting an array-type microcoil element formed of microcoil elements in multiple embodiments of the disclosure.

FIG. 4A is a schematic diagram depicting an array-type microcoil element 40 that is formed of multiple microcoil units 20 that are arranged in an array. It should be noted that the shapes and the quantity of the microcoil elements are not limited by that shown in FIG. 4A.

Similarly, the single microcoil element 20 also includes a wiring layer, in which multiple loops of continuous multiple metal line segments are formed from a starting point and around the starting point. The microcoil element 20 includes an electrode layer having at least one first electrode zone that converges first electrode ends of the metal line segments and at least one second electrode zone that converges second electrode ends of the metal line segments. According to a practical requirement, one or more first electrode zones and second electrode zones are provided. It should be noted that the first electrode zone converging the first electrode ends of the metal line segments and the second electrode zone converging the second electrode ends of the metal line segments can be converged by an electrical connection layer of another element. The electrical connection layer is accordingly used to converge the electrode ends. On the electrical connection layer, multiple metal lines lead the first electrode ends of multiple metal line segments on the wiring layer to the at least one first electrode zone of the electrode layer, and also lead the second electrode ends of the multiple metal line segments to the at least one second electrode zone of the electrode layers.

Besides the above embodiments, in accordance with a requirement, such as an equivalent magnetic field, the array-type microcoil element is configured to dispose multiple different shapes or sizes of microcoil elements. References are made to FIG. 4B and FIG. 4C.

Figure 4B:
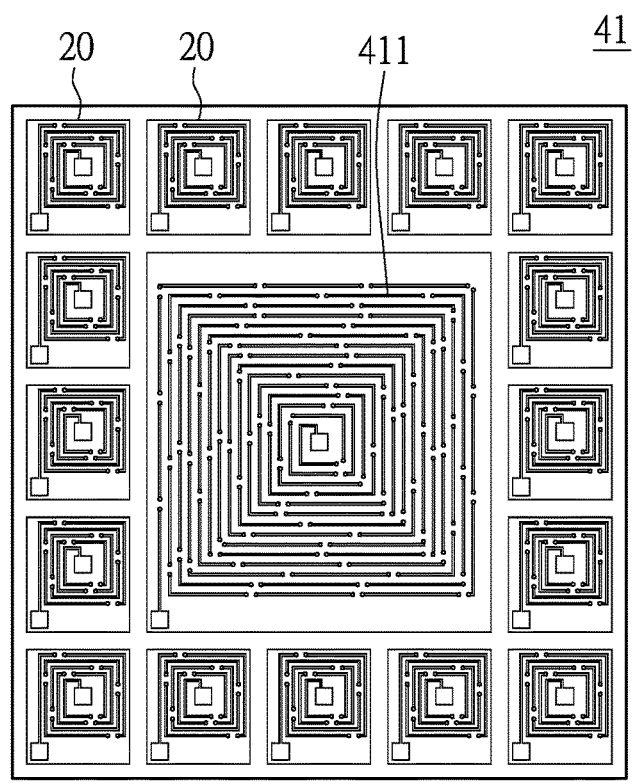

FIG. 4B is a schematic diagram depicting an array-type microcoil element 41 formed of multiple microcoil units 20 that are arranged in an array according to one embodiment of the disclosure. In a circuit layout covering the multiple microcoil units 20, a larger microcoil unit 411 can be disposed, but not limited to, at a specific position based on a requirement of magnetic field. However, this additional microcoil unit can also be as small as a few millimeters. The microcoil units 20 around or at one side of the microcoil unit 411 can be interacted with the microcoil unit 411 so as to generate an equivalent magnetic field through an effect of amplifying or offsetting. Therefore, the whole array-type microcoil element 41 can meet the requirement of magnetic field.

Figure 4C:
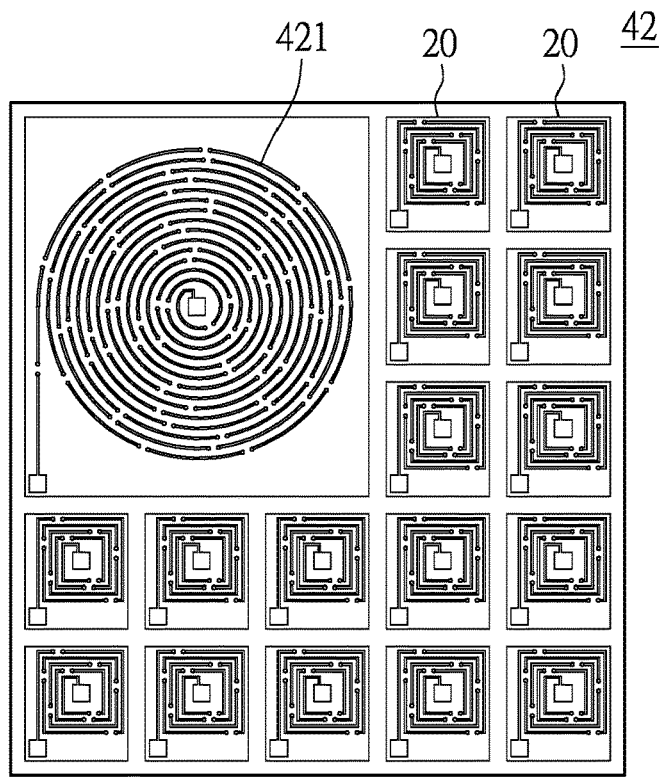

FIG. 4C is another schematic diagram depicting an array-type microcoil element 42 according to one embodiment of the disclosure. A magnetic element is schematically shown in the diagram. A larger microcoil unit 421 can be disposed at a specific position in the array-type microcoil element 42. The microcoil unit 421 has a different shape from the other microcoil units 20. Similarly, the magnetic field may be amplified or offset when the magnetic field generated by the microcoil unit 421 interacts with the magnetic fields generated by the adjacent microcoil units 20 so as to render an equivalent magnetic field that meets a practical requirement.

Figure 4D:
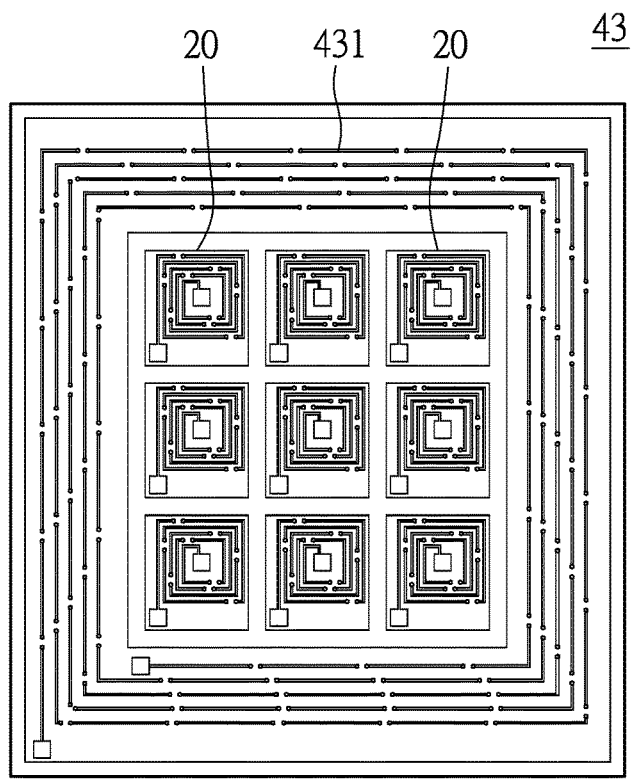

In accordance with a requirement of the equivalent magnetic field, in one aspect, the array-type microcoil element is configured to dispose an outer coil unit around one or more microcoil elements. Reference is made to FIG. 4D, which depicts an array-type microcoil element 43. An outer coil unit 431 is formed around multiple microcoil units 20 that are arranged in an array. The outer coil unit 431 loops around the inner microcoil units 20. Similarly, for providing a magnetic field in a magnetic component, the array-type microcoil element 43 is provided based on various conditions such as quantity, area, length of every line segment, thickness of the line segment and material of the microcoil units 20 and design of the outer coil unit 431.

It should be noted that, other than a design that is specially considered for specific purposes, the currents flowing the metal line segments formed in every microcoil element, as shown in FIG. 2, FIG. 4A through FIG. 4D, have the same direction when they are energized. Therefore, a magnetic field equivalent to the magnetic field generated by a multi-turn coil is generated. For the array-type microcoil element (40, 41, 42, 43), an equivalent magnetic field that can diminish a non-uniform magnetic field at the edge of the individual microcoil element is generated.

Further, the above-mentioned microcoil unit 20 and the various array-type microcoil elements (40, 41, 42 and 43) can be used together and is not limited in the present disclosure. The starting point (e.g., the first electrode 21 of FIG. 2) of the multiple metal line segments of the microcoil unit can be an electrode end disposed near a central portion of the element or any position deviated from the central portion of the element according to a practical design.

In addition to the types of the microcoil element shown in FIG. 2, FIG. 3 or FIGS. 4A through 4D, a single microcoil element can be used as a microcoil unit 50 according to one embodiment of the disclosure. The microcoil unit 50 includes a starting point that can be an electrode end near a central portion of the element and the starting point acts as a first electrode of the microcoil element. The first electrode can be a negative electrode of the whole element. In the diagram, the continuous multiple metal line segments start from the starting point and around the starting point so as to form a concentric polygon element. The end of the metal line segments forms a second electrode that can be a positive electrode of the whole element.

Figure 5A:
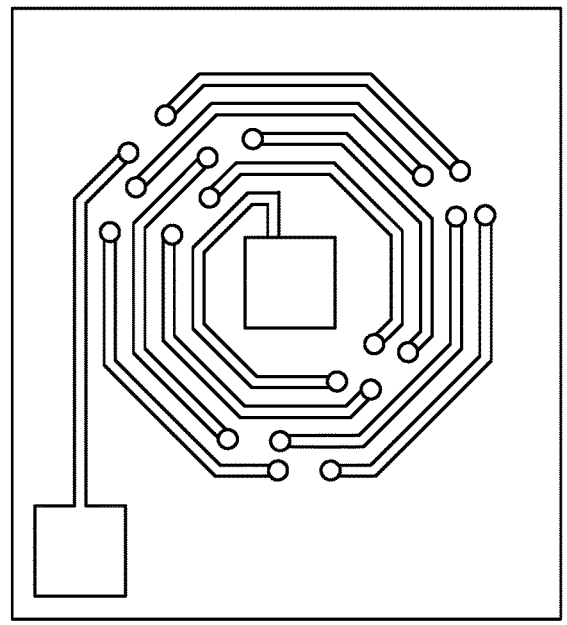
FIG. 5A and FIG. 5B show schematic diagrams depicting wirings upon the microcoil element in one embodiments of the disclosure.
Figure 5B:
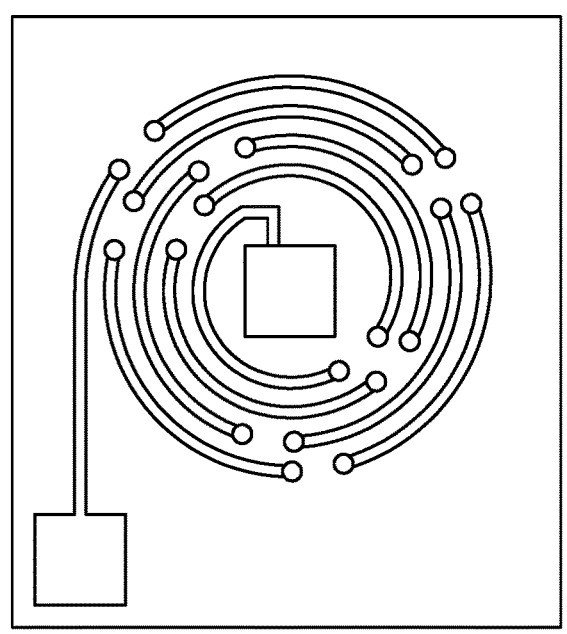

FIG. 5B is a schematic diagram depicting a microcoil unit 52 that is formed of a single microcoil element according to one embodiment of the disclosure. The multiple metal line segments of the microcoil unit 52 loop around a starting point so as to form a concentric circle layout. The starting point acts as a first electrode and the other end acts as a second electrode of the microcoil unit 52.

Figure 6:
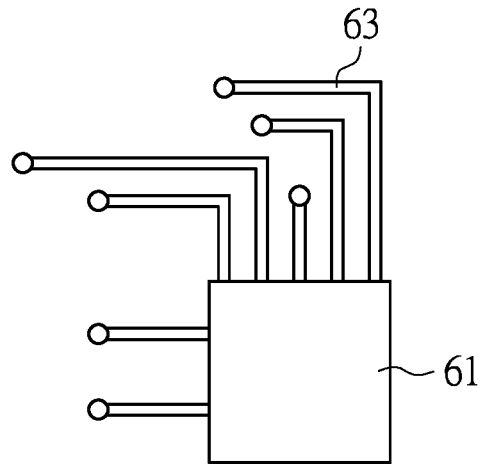
FIG. 6 is a schematic diagram depicting electrode zone that is used to converge electrode ends of multiple metal line segments on the electrode layer of the microcoil element in one embodiment of the disclosure.

FIG. 6 is a schematic diagram depicting an electrode layer of a microcoil element according to one embodiment of the disclosure. The electrode layer is used to converge electrode ends of the multiple metal line segments. A negative electrode convergence layer 60 is provided for converging the first electrode ends, e.g., the negative electrodes, of the multiple line segments over a wiring layer. In one aspect, the negative electrode convergence layer 60 is such as a pad that forms an electrode zone 61. The electrode zone 61 has a sufficient area to accommodate multiple metal lines 63. The metal lines 63 in the negative electrode convergence layer 60 are used to lead the connections of the negative electrodes of the multiple metal line segments over the wiring layer.

Figure 7:
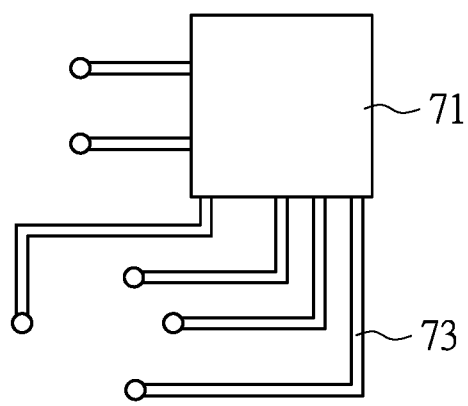
FIG. 7 is another schematic diagram depicting another electrode zone that is used to converge electrode ends of multiple metal line segments on the electrode layer of the microcoil element in another embodiment of the disclosure.

FIG. 7 is another schematic diagram depicting another electrode ends that act as positive electrodes of the multiple metal line segments converged to an electrode layer of the microcoil element.

A positive electrode convergence layer 70 includes an electrode zone 71 that is configured to have a sufficient area to accommodate multiple metal lines 73. The metal lines 73 in the positive electrode convergence layer 70 are used to lead the connections of the positive electrodes of the multiple metal line segments over the wiring layer.

Figure 8:
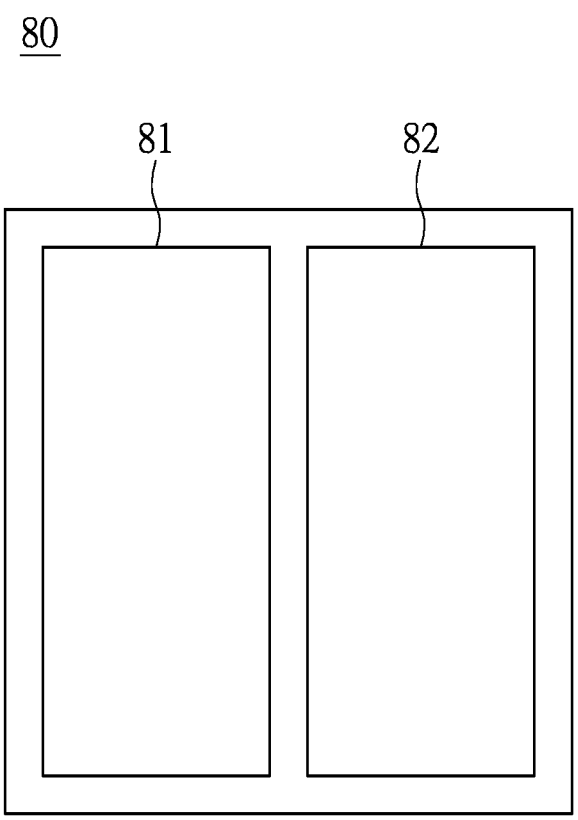
FIG. 8 is one further schematic diagram depicting an electrode convergence layer of the microcoil element in one further embodiment of the disclosure.

According to the embodiments of the disclosure, the electrodes shown in FIG. 6 and FIG. 7 can be in a circuit layer of the same electrode layer; or alternatively, the electrodes can be in two or more circuit layers of different electrode layers. The circuit layer can be produced by a coating process, a metallization process or an etching process. One more embodiment of the microcoil element can be referred to FIG. 8, which a schematic diagram depicting an electrode convergence layer of the microcoil element. The electrode layer 80 includes a first electrode zone 81 and a second electrode zone 82. The electrodes of the metal line segments are leaded to the first electrode zone 81 and the second electrode zone 82 through vias or wires.

Overall, on an electrode layer of each of the microcoil elements, or on an additional electrical connection layer, multiple metal lines are used to lead the first electrode ends of multiple metal line segments on the wiring layer to the at least one first electrode zone 81 of the electrode layer, and also lead the second electrode ends of the multiple metal line segments to the at least one second electrode zone 82 of the electrode layers.

In an electrical design, the first electrode end of every metal line segment on the wiring layer is a negative electrode, and the second electrode end is a positive electrode. The positive electrodes of the multiple metal line segments are connected in parallel through vias, and the negative electrodes thereof are connected in parallel through other vias. Alternatively, referring to the various array-type microcoil elements shown in FIGS. 4A through 4D, the first electrode zones and the second electrode zones on the electrode layer in each of the microcoil elements in array-type microcoil element are respectively connected to an overall negative contact zone and an overall positive contact zone shown in FIG. 6, FIG. 7 or FIG. 8. For example, the overall negative contact zone can be an electrode zone 61 of FIG. 6 or the first electrode zone 81 of FIG. 8; and the overall positive contact zone can be an electrode zone 71 of FIG. 7 or the second electrode zone 82 of FIG. 8. Therefore, the microcoil elements of the array-type microcoil element can be connected in parallel by the above-described electrode zones.

Figure 9:
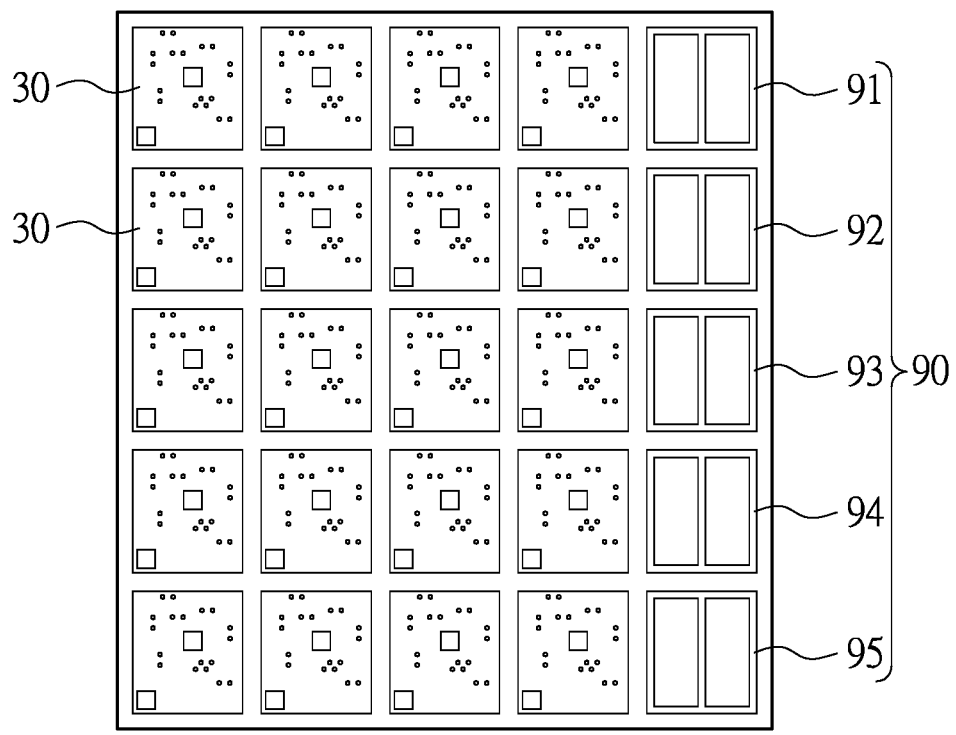
FIG. 9 is a schematic diagram depicting a hybrid layer including contact units and electrode units of microcoil elements according to one embodiment of the disclosure.

FIG. 9 shows one further embodiment of the disclosure. A hybrid layer having a contact unit and an electrode unit is provided. The contact unit is such as the contact unit 30 of FIG. 3. The electrode unit is such as the first electrode zone 81 and the second electrode zone 82 of FIG. 8 with respect to one microcoil element of the array-type microcoil element.

According to an embodiment showing an arrangement of the array-type microcoil element, in the layout for leading the electrodes of the microcoil element, a layer shown in FIG. 9 includes multiple contact units 30 that occupy a space for accommodating the contacts of the electrodes that lead the electrode ends of the metal line segments over the wiring layer to an electrode zone 90 having electrode units 91, 92, 93, 94 and 95 through vias.

While designing the microcoil element or the array-type microcoil element, size and shape of every microcoil element can be customized based on design of a product. The microcoil element can be flexibly designed based on the requirements such as an impedance value, a magnetic field, size and shape of the product due to its miniature and multiple-line-segment design. A total length, a line width, a line spacing between adjacent metal line segments, a length of each line segment, turns of microcoil, a loop distance and/or material of the metal line segments are determined according to the requirement of an impedance value, a magnetic field and/or size of the microcoil element. Furthermore, a spacing between the adjacent microcoil units and/or a quantity of the total microcoil elements may also be considered therefor.

In one further embodiment of the disclosure, a multilayer structure is designed according to a practical requirement. The multilayer structure includes a wiring layer, an electrode layer and/or a convergence layer that is used for converging the positive and negative electrodes of the microcoil elements. These components of the microcoil elements can be interconnected in parallel through vias. The design of the microcoil element may also refer to the above-mentioned parameters such as shape of the continuous multiple line segments, width and length of length of each line segment, turns of microcoil, a loop distance and a total length.

Figure 10:
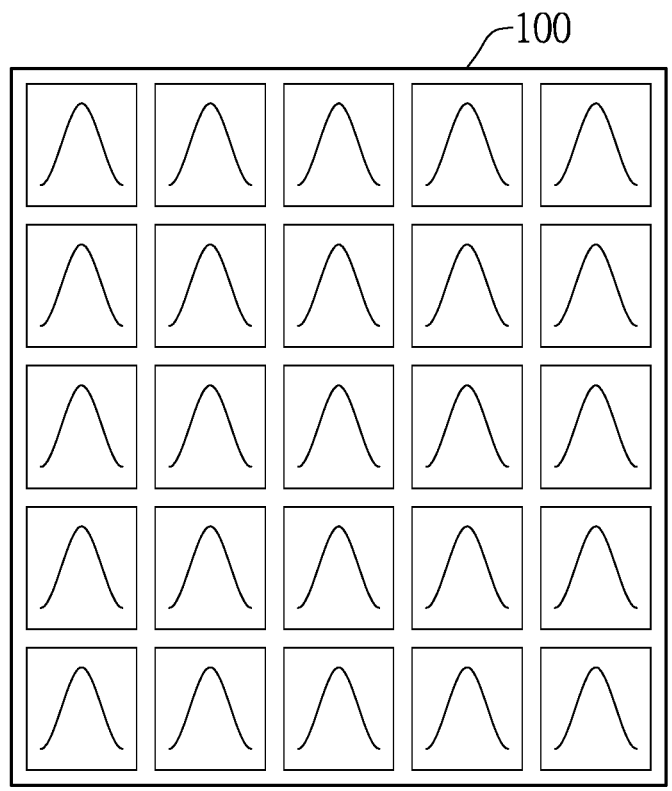
FIG. 10 is a schematic diagram showing magnetic fields generated in an array-type microcoil element according to one embodiment of the disclosure.

While the parameters are decided, an equivalent magnetic field generated by the microcoil elements is one of the main design considerations for designing an array-type microcoil element that renders a distribution of magnetic fields shown in FIG. 10.

The single microcoil element schematically shown, but not limited to, in FIG. 2, FIG. 5A and FIG. 5B generate a magnetic field equivalent to a multiturn coil when the microcoil element is energized. Strength of the magnetic field can be determined by a passing current. However, there may be a large magnetic field change at an edge of the microcoil element. In general, a middle portion of the element generates a stronger magnetic field, and the edge of the element generates a weaker magnetic field. For generating a stronger and uniform magnetic field, the array-type microcoil element is provided. Reference is made to FIG. 10, which is a schematic diagram depicting an array-type microcoil element that is consisted of multiple microcoil elements. An overall magnetic field generated by the multiple microcoil elements can effectively reduce the non-uniform magnetic field formed at the edge of every individual microcoil element. An equivalent magnetic field evenly covering a wide range is provided when the multiple microcoil elements are energized.

Figure 11:
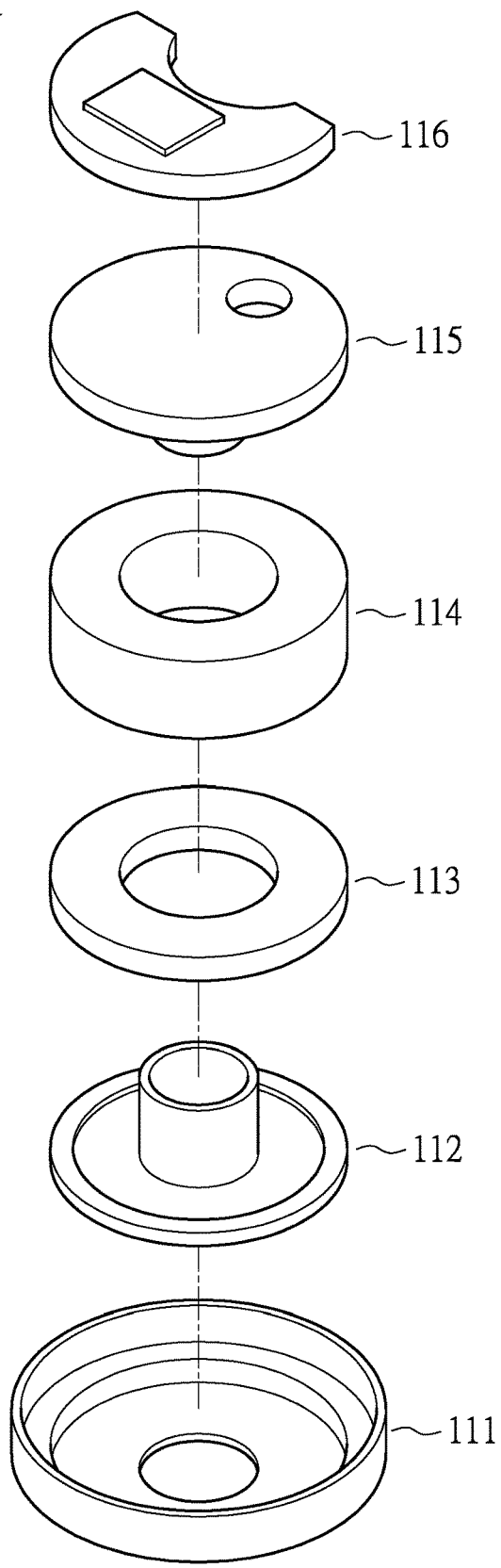
FIG. 11 is an exploded diagram depicting an earphone structure having microcoil elements in one embodiment of the disclosure.

According to the above-described embodiments of the microcoil element, the microcoil element is mainly applied to a magnetic component of an electronic device. Since the scale of the microcoil element is small enough, it can advantage an earphone device as shown in FIG. 11 to reduce space requirement and to cover multiple frequency bands with multiple speaker units. For example, the manufacturing process for producing the microcoil element can be a 65-nanometer process that can produce the micron or nanometer level of line width and line spacing.

A speaker 11 is schematically shown in FIG. 11. In general, main structure of the speaker 11 includes a shell 111, a diaphragm 112, a spacer 113, a magnetic component 114, a guide magnet 115 and a circuit board 116. The one or more microcoil elements at least implement the magnetic component 114 of the speaker 11. A circuit board 116 is used to connect to a power supply that supplies power to the magnetic component 114. The magnetic component 114 can be the above-described single microcoil element or array-type microcoil element. The magnetic component 114 can also be designed based on a requirement of impedance value, magnetic field or size. The magnetic component 114 is configured to dispose multiple microcoil elements or multiple layers of the array-type microcoil elements)

In one further aspect, when the magnetic component is produced, various ways for enhancing the magnetic permeability of the magnetic component can be utilized. For example, when the multi-layer magnetic component is produced, a magnetic-permeability substance is coated on one side of the magnetic component; or alternatively, a magnetic-permeability substance is coated on the one or more layers of the multi-layer magnetic component. The materials of the magnetic-permeability can be iron, nickel, manganese, zinc, cobalt, platinum, aluminum or the like that is able to enhance an overall magnetic permeability of the magnetic component. In one embodiment of the disclosure, when selecting the material of the magnetic component, a substrate doped with magnetic-permeable elements can be selected as the material of the magnetic component for enhancing an overall magnetic permeability of the magnetic component. In one further embodiment, after the magnetic component is produced, a magnetic-permeable substance can be plated on a side of the magnetic component for enhancing the magnetic permeability thereof.

A unit often used in a speaker 11 or an earphone is generally a voice coil made of a cone-type diaphragm 112, a magnetic component 114 and a guide magnet 115. When the current flows the magnetic component 114, a magnetic field interacts with the guide magnet 115 so as to drive the voice coil for changing a direction of the current for the magnetic component 114. A magnetic field with an opposite polarity is accordingly generated. The moving direction of the voice coil is also changed for driving the diaphragm 112. In one of the embodiments of the disclosure, the single one microcoil element or the array-type microcoil element embodies the magnetic component 114 that is configured to generate a magnetic field after being energized. The impedance can be well controlled for driving the voice coil more precisely and outputting a better quality of voice.

In conclusion, through the various embodiments implemented by the microcoil element in accordance with the present disclosure, a single one microcoil element or an array-type microcoil element made of multiple microcoil elements embodies a magnetic element of an electronic device. The microcoil element is consisted of multiple metal line segments. The element can include one or more layers of structure. As compared to the modern design, the microcoil of the present disclosure is stacked with multiple disconnected line segments in a loop so as to generate an equivalent magnetic field. One of the objectives of the stacked structure is to increase a current density, and also to reduce an overall resistance of the element through a parallel connection. Thus, in an electrical design, the multiple negative electrodes of every microcoil element are configured to connect to a negative contact zone, and the multiple positive electrodes of the microcoil element are configured to connect to a positive contact zone. In the electrical design, the multiple metal line segments are connected in parallel, and the electrode ends can be connected to the overall negative contact zones and the overall positive contact zones in parallel respectively. The multiple microcoil elements can therefore be connected in parallel. Furthermore, the various wiring parameters applied to the metal line segments of the microcoil can be applicable to various requirements since they can be determined according to a practical demand of an impedance, a magnetic field or a size.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A microcoil element, comprising:
a wiring layer having continuous multiple metal line segments that is formed of multiple loops of continuous multiple metal line segments around a starting point, and every metal line segment including a first electrode end and a second electrode end, wherein the starting point is a first electrode of the microcoil element, and an end of the continuous multiple metal line segments is a second electrode of the microcoil element; and
at least one first electrode zone and at least one second electrode zone, wherein the at least one first electrode zone is used to converge the first electrode ends of the multiple metal line segments and the first electrode end of every metal line segment on the wiring layer is leaded to the at least one first electrode zone via multiple metal lines; and the at least one second electrode zone is used to converge the second electrode ends of the multiple metal line segments and the second electrode end of every metal line segment is leaded to the at least one second electrode zone via multiple metal lines.

2. The microcoil element according to claim 1, further comprising an electrical connection layer, on the electrical connection layer, multiple metal lines lead the first electrode ends of multiple metal line segments on the wiring layer to the at least one first electrode zone, and also lead the second electrode ends of the multiple metal line segments to the at least one second electrode zone.

3. The microcoil element according to claim 2, wherein the first electrode end of every metal line segment on the wiring layer is a negative electrode, the second electrode end is a positive electrode, in which the positive electrodes of the multiple metal line segments are connected in parallel through vias and the negative electrodes of the multiple metal line segments are connected in parallel through vias.

4. The microcoil element according to claim 1, wherein the starting point forms the first electrode of the microcoil element, and the multiple continuous multiple metal line segments form a concentric circle layout or a concentric polygon layout around the starting point.

5. The microcoil element according to claim 4, wherein, a total length, a line width, a line spacing between adjacent metal line segments, a length of each line segment, turns of microcoil, a loop distance and/or material of the metal line segments are determined according to a requirement of an impedance value, a magnetic field or size of the microcoil element.

6. An array-type microcoil element, comprising:
multiple microcoil elements, in which each of microcoils is energized to generate a magnetic field equivalent to a multiturn coil; and the array-type microcoil element is used to generate an equivalent magnetic field through the energized multiple microcoil elements, wherein each of the microcoil elements includes:
a wiring layer having continuous multiple metal line segments that is formed of multiple loops of continuous multiple metal line segments around a starting point, and every metal line segment including a first electrode end and a second electrode end, wherein the starting point is a first electrode of the microcoil element, and an end of the continuous multiple metal line segments is a second electrode of the microcoil element; and
at least one first electrode zone and at least one second electrode zone, wherein the at least one first electrode zone is used to converge the first electrode ends of the multiple metal line segments and the first electrode end of every metal line segment on the wiring layer is leaded to the at least one first electrode zone via multiple metal lines; and the at least one second electrode zone is used to converge the second electrode ends of the multiple metal line segments and the second electrode end of every metal line segment is leaded to the at least one second electrode zone via multiple metal lines.

7. The array-type microcoil element according to claim 6, wherein each of the microcoil elements further comprises an electrical connection layer, on the electrical connection layer, multiple metal lines lead the first electrode ends of multiple metal line segments on the wiring layer to the at least one first electrode zone, and also lead the second electrode ends of the multiple metal line segments to the at least one second electrode zone.

8. The array-type microcoil element according to claim 7, wherein the first electrode end of every metal line segment on the wiring layer is a negative electrode, the second electrode end is a positive electrode, in which the positive electrodes of the multiple metal line segments are connected in parallel through vias and the negative electrodes of the multiple metal line segments are connected in parallel through vias.

9. The array-type microcoil element according to claim 7, further comprising an overall negative contact zone, an overall positive contact zone and an electrode layer, wherein the at least one first electrode zone and the at least one second electrode zone are formed on the electrode layer and leaded to the overall negative contact zone and the overall positive contact zone respectively through vias, and the multiple microcoil elements are connected in parallel.

10. The array-type microcoil element according to claim 6, wherein, a total length, a line width, a line spacing between adjacent metal line segments, a length of each line segment, turns of microcoil, a loop distance and/or material of the metal line segments are determined according to a requirement of an impedance value, a magnetic field or size of the microcoil element.

11. The array-type microcoil element according to claim 10, wherein, in accordance with a requirement of the equivalent magnetic field, the array-type microcoil element is configured to dispose multiple different shapes or sizes of microcoil elements.

12. The array-type microcoil element according to claim 10, wherein, in accordance with a requirement of the equivalent magnetic field, the array-type microcoil element is configured to dispose an outer coil unit around one or more microcoil elements.

13. A microcoil device, comprising:
at least one magnetic component constituted of one or more microcoil elements, wherein the magnetic component is a single microcoil element or an array-type microcoil element; and
a circuit board connected with a power supply for supplying power to the at least one magnetic component;
wherein the microcoil element includes:
a wiring layer having continuous multiple metal line segments that is formed of multiple loops of continuous multiple metal line segments around a starting point, and every metal line segment including a first electrode end and a second electrode end, wherein the starting point is a first electrode of the microcoil element, and an end of the continuous multiple metal line segments is a second electrode of the microcoil element; and
at least one first electrode zone and at least one second electrode zone, wherein the at least one first electrode zone is used to converge the first electrode ends of the multiple metal line segments and the first electrode end of every metal line segment on the wiring layer is leaded to the at least one first electrode zone via multiple metal lines; and the at least one second electrode zone is used to converge the second electrode ends of the multiple metal line segments and the second electrode end of every metal line segment is leaded to the at least one second electrode zone via multiple metal lines.

14. The microcoil device according to claim 13, wherein, a total length, a line width, a line spacing between adjacent metal line segments, a length of each line segment, turns of microcoil, a loop distance and/or material of the metal line segments are determined according to a requirement of an impedance value, a magnetic field or size of the microcoil element, or including a quantity of microcoil elements adopted in the array-type microcoil element and a spacing between the adjacent microcoil elements thereof; wherein, in accordance with a requirement of the equivalent magnetic field, the array-type microcoil element is configured to dispose multiple different shapes or sizes of microcoil elements, or alternatively to dispose an outer coil unit around one or more microcoil elements.

15. The microcoil device according to claim 14, wherein, in accordance with a requirement of the impedance value, the magnetic field or size, the magnetic component is configured to dispose multiple microcoil elements or multiple layers of the array-type microcoil elements.

16. The microcoil device according to claim 15, wherein, when the multi-layer magnetic component is produced, a magnetic-permeability substance is coated on the one or more layers of the multi-layer magnetic component.

17. The microcoil device according to claim 15, wherein, a substrate doped with magnetic-permeable elements is selected as material of the magnetic component.

18. The microcoil device according to claim 15, wherein, a magnetic-permeability substance is coated on one side of the magnetic component.

* * * * *